United States Patent
Kim

(10) Patent No.: US 9,495,643 B2
(45) Date of Patent: Nov. 15, 2016

(54) SEMICONDUCTOR DEVICE CAPABLE OF TESTING BONDING OF PAD

(71) Applicant: SK hynix Inc., Icheon-si Gyeonggi-do (KR)

(72) Inventor: Youk Hee Kim, Icheon-si (KR)

(73) Assignee: SK HYNIX INC., Icheon-si (KR)

( * ) Notice: Subject to any disclaimer, the term of this patent is extended or adjusted under 35 U.S.C. 154(b) by 0 days.

(21) Appl. No.: 13/778,662

(22) Filed: Feb. 27, 2013

(65) Prior Publication Data

US 2014/0048803 A1 Feb. 20, 2014

(30) Foreign Application Priority Data

Aug. 17, 2012 (KR) .................. 10-2012-0090007

(51) Int. Cl.
| | | |
|---|---|---|
| H01L 21/66 | (2006.01) | |
| H03L 7/06 | (2006.01) | |
| H03L 7/08 | (2006.01) | |
| G06N 99/00 | (2010.01) | |
| H01P 7/00 | (2006.01) | |
| H01P 7/08 | (2006.01) | |
| B82Y 10/00 | (2011.01) | |

(52) U.S. Cl.
CPC .............. *G06N 99/002* (2013.01); *B82Y 10/00* (2013.01); *H01P 7/00* (2013.01); *H01P 7/08* (2013.01); *H01P 7/082* (2013.01)

(58) Field of Classification Search
CPC ....... H01L 22/30; H01L 22/32; H01L 22/34; H01L 25/0657; H01L 21/66; H03L 7/06; H03L 7/08; H03L 7/081; H03L 7/0812; G01R 31/28

See application file for complete search history.

(56) References Cited

U.S. PATENT DOCUMENTS

| | | | |
|---|---|---|---|
| 6,282,680 B1 * | 8/2001 | Takagi | G01R 31/3016 714/724 |
| 6,421,801 B1 * | 7/2002 | Maddux et al. | 714/744 |
| 7,902,896 B2 | 3/2011 | Booth | |
| 7,999,531 B2 | 8/2011 | Ichiyama | |
| 2003/0156462 A1 * | 8/2003 | Lim et al. | 365/189.05 |
| 2005/0094448 A1 * | 5/2005 | Lee et al. | 365/200 |
| 2006/0087909 A1 * | 4/2006 | Okuda et al. | 365/233 |
| 2008/0025383 A1 * | 1/2008 | Li | 375/226 |
| 2009/0154271 A1 * | 6/2009 | Kwean | 365/201 |
| 2011/0093235 A1 * | 4/2011 | Oh et al. | 702/120 |
| 2011/0140730 A1 * | 6/2011 | Zieren | G01R 31/048 324/762.03 |
| 2011/0204941 A1 * | 8/2011 | Lee | G11C 7/22 327/158 |
| 2013/0099838 A1 * | 4/2013 | Kim et al. | 327/158 |
| 2014/0003170 A1 * | 1/2014 | Ku | 365/193 |
| 2014/0050284 A1 * | 2/2014 | Byeon | 375/316 |
| 2014/0177314 A1 * | 6/2014 | Chu | 365/96 |

* cited by examiner

*Primary Examiner* — Fazli Erdem
(74) *Attorney, Agent, or Firm* — William Park & Associates Ltd.

(57) ABSTRACT

A test circuit includes a phase difference detection unit and a determination unit. The phase difference detection unit detects a phase difference between a first signal received through a first pad and a second signal received through a second pad. The determination unit compares the detected phase difference with a preset amount of delay and outputs a result signal.

20 Claims, 3 Drawing Sheets

SEMICONDUCTOR DEVICE CAPABLE OF TESTING BONDING OF PAD

CROSS-REFERENCES TO RELATED APPLICATION

The present application claims priority under 35 U.S.C. §119(a) to Korean application number 10-2012-0090007, filed on Aug. 17, 2012, in the Korean Intellectual Property Office, which is incorporated herein by reference in its entirety.

BACKGROUND

1. Technical Field

The present invention generally relates to a semiconductor device, and more particularly, to a semiconductor device capable of testing the bonding of a pad.

2. Related Art

A semiconductor chip receives a signal through a pad from an exterior. Generally, the pad of the semiconductor chip is wire-bonded to a terminal of a semiconductor substrate which directly receives an external signal. Recently, in order to reduce the pitch and pad size of a semiconductor chip, a package method using bump bonding, instead of wire bonding, has been proposed. The bump bonding is a method of directly connecting the pad of a memory chip to the terminal of the semiconductor substrate through a bump in a wireless bonding manner. The packaging scheme using bump bonding as described above is called a flip chip.

The use of flip chip bonding enables reduction of the pad size of the semiconductor chip. Therefore, when a scratch or the like occurs on a pad, bump bonding is not normally achieved. When bump bonding is not normally achieved, a semiconductor chip cannot input and output a signal through the pad, so that the semiconductor chip can not sufficiently show the function thereof.

When the bump bonding is not completely formed, it is impossible to input and output a signal through a pad, so that the defects of the bump bonding can be easily detected. However, when bump bonding is incompletely achieved, such as when only a part of the bump bonding is formed, the defects of the bump bonding cannot be easily detected because signals can be inputted and outputted through a pad. When bump bonding is incomplete, an input signal can be delayed, which can cause malfunction of an internal circuit of a semiconductor chip. However, since there is no method of making it possible to accurately detect a partial defect of the bump bonding, it is difficult, when malfunction of a semiconductor chip occurs, to determine whether the malfunction is caused by a defect of bump bonding or by a defect of an internal circuit.

SUMMARY

A test circuit capable of accurately detecting whether bonding of a pad is normally achieved, and a semiconductor device including the same are described herein.

In an embodiment, a test circuit includes: a phase difference detection unit configured to detect a phase difference between a first signal received through a first pad and a second signal received through a second pad; and a determination unit configured to compare the detected phase difference with a preset amount of delay, and to output a result signal.

In an embodiment, a semiconductor device includes: a first pad; a second pad; a first reception unit configured to receive a first signal which is inputted through the first pad; a second reception unit configured to receive a second signal which is inputted through the second pad; a phase difference detection unit configured to detect a phase difference between the outputs of the first and second reception units; and a determination unit configured to compare the phase difference with a preset amount of delay, and to output a result signal.

In an embodiment, a semiconductor device includes: a plurality of pads configured to receive external signals; a phase difference detection unit configured to detect a phase difference between the external signals received through the plurality of pads; and a determination unit configured to compare the phase difference with a preset amount of delay, and to output a result signal.

BRIEF DESCRIPTION OF THE DRAWINGS

Features, aspects, and embodiments are described in conjunction with the attached drawings, in which.

DETAILED DESCRIPTION

Hereinafter, a semiconductor device capable of testing the bonding of a pad according to the various embodiments will be described below with reference to the accompanying drawings through the embodiments.

Figure 1:
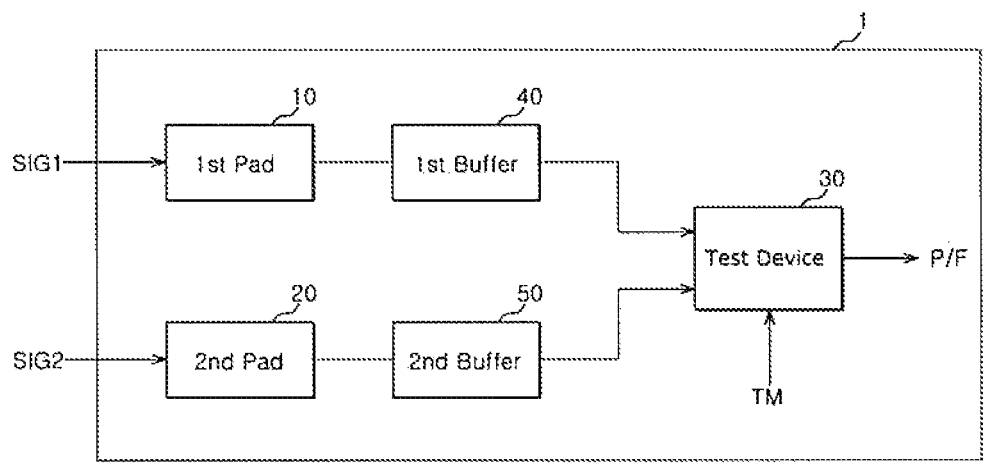
FIG. 1 is a diagram schematically illustrating the configuration of a semiconductor device according to an embodiment.

FIG. 1 is a diagram schematically illustrating the configuration of a semiconductor device 1 according to an embodiment. In FIG. 1, the semiconductor device 1 may include a first pad 10, a second pad 20 and a test device 30. The first and second pads 10 and 20 receive external signals applied from an exterior. The first pad 10 can receive a first signal SIG1, and the second pad 20 can receive a second signal SIG2. The first and second signals SIG1 and SIG2 can be signals different from each other, or especially, can be the same signal for a test operation. That is to say, in a normal operation of a semiconductor device, the first and second pads 10 and 20 can receive signals coinciding with the respective functions, and can receive an external signal which is simultaneously inputted in a test operation, to which the embodiments are not delimited.

The first and second pads 10 and 20 are input/output pads, and can receive one among an address signal, a command signal, and data. Otherwise, in a test operation, a specific signal inputted from test equipment or a controller can be received. According to an embodiment, the first and second pads 10 and 20 can include a flip chip bonding pad or a bump bonding pad.

The test device 30 receives the first signal SIG1 through the first pad 10 and receives the second signal SIG2 through the second pad 20. The test device 30 can determine whether or not the bump bonding of the first and second pads 10 and 20 have been normally formed depending on the phase difference between the first signal SIG1 and the second signal SIG2. When an external signal is applied to the first and second pads 10 and 20 at the same time point, and the first and second pads 10 and 20 are normally achieved, the phase difference between a signal inputted through the first pad 10 and a signal inputted through the second pad 20 becomes very small. Ideally, the phase difference becomes zero. In contrast, when the first and second pads 10 and 20 are incompletely formed, the phase difference between a signal inputted through the first pad 10 and a signal inputted through the second pad 20 becomes larger than a threshold value. Therefore, the test device 30 may sense the phase difference between the first signal SIG1 received through the first pad 10 and the second signal SIG2 received through the second pad 20, and can determine that the bump bonding of the first and second pads 10 and 20 is incomplete when the phase difference is larger than a threshold value, and that the bump bonding of the first and second pads 10 and 20 has been normally and completely formed when the phase difference is smaller than the threshold value.

The threshold value can be a preset amount of delay, and the preset amount of delay can optionally vary by a delay selection signal, a description of which will be given later in this document. The test device 30 can receive a test mode signal TM to perform a test operation of the semiconductor device 1. The test mode signal TM is a signal for distinguishing a test operation from the other operations, and can be enabled when the test operation is performed.

In FIG. 1, the semiconductor device 1 can additionally include a first reception unit 40 and a second reception unit 50. The first and second reception units 40 and 50 may be connected with the first and second pads 10 and 20, respectively. The first reception unit 40 buffers the first signal SIG1 received through the first pad 10. The second reception unit 50 buffers the second signal SIG2 received through the second pad 20. The first and second reception units 40 and 50 may be normal receiver circuits or buffer circuits.

Figure 2:
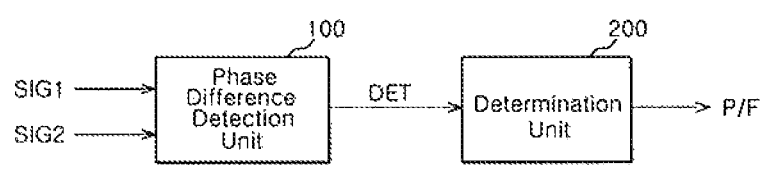
FIG. 2 is a block diagram schematically illustrating a configuration capable of being implemented in a test circuit of FIG. 1.

FIG. 2 is a block diagram schematically illustrating a configuration capable of being implemented in the test device 30 of FIG. 1. In FIG. 2, the test device 30 may include a phase difference detection unit 100 and a determination unit 200. The phase difference detection unit 100 receives the first and second signals SIG1 and SIG2 from the first and second pads 10 and 20 or from the first and second reception units 40 and 50. The phase difference detection unit 100 generates a detection signal DET which has a pulse width corresponding to the phase difference between the first and second signals SIG1 and SIG2 received through the first and second pads 10 and 20. That is to say, the phase difference detection unit 100 generates the detection signal DET having a narrow pulse width when the phase difference between the first and second signals SIG1 and SIG2 received through the first and second pads 10 and 20 is small, and generates the detection signal DET having a wide pulse width when the phase difference between the first and second signals SIG1 and SIG2 received through the first and second pads 10 and 20 is large.

The determination unit 200 may compare the phase difference between the first and second signals SIG1 and SIG2 sensed by the phase difference detection unit 100 with a preset amount of delay to generate a result signal P/F. For example, the determination unit 200 can generate the result signal P/F which may be disabled when the phase difference between the first and second signals SIG1 and SIG2 received through the first and second pads 10 and 20 is smaller than the preset amount of delay, and generate the result signal P/F which may be enabled when the phase difference is larger than the preset amount of delay. The determination unit 200 receives the detection signal DET. The determination unit 200 can compare the detection signal DET with the preset amount of delay and generate the result signal P/F.

Figure 3:
FIG. 3 is a diagram illustrating a configuration capable of being implemented in a phase difference detection unit of FIG. 2.

FIG. 3 is a diagram illustrating a configuration capable of being implemented in the phase difference detection unit 100 of FIG. 2. In FIG. 3, the phase difference detection unit 100 may include an exclusive-OR gate XOR. The exclusive-OR gate XOR receives the first and second signals SIG1 and SIG2 from the first and second pads 10 and 20, and generates the detection signal DET. The exclusive-OR gate XOR generates the detection signal DET which has a phase width corresponding to the phase difference between the first and second signals SIG1 and SIG2 received through the first and second pads 10 and 20.

Figure 4:
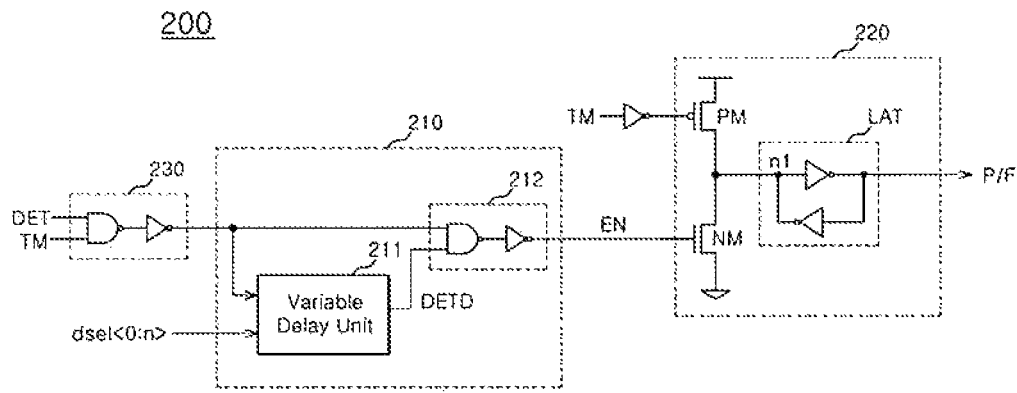
FIG. 4 is a diagram illustrating a configuration capable of being implemented in a determination unit of FIG. 2.

FIG. 4 is a diagram illustrating a configuration capable of being implemented in the determination unit 200 of FIG. 2. In FIG. 4, the determination unit 200 may include a comparison unit 210 and an output unit 220. The comparison unit 210 may compare the pulse width of the detection signal DET with a preset amount of delay, and may generate an enable signal EN. For example, the comparison unit 210 can disable the enable signal EN when the pulse width of the detection signal DET is smaller than the preset amount of delay, and can enable the enable signal EN when the pulse width of the detection signal DET is larger than the preset amount of delay.

The comparison unit 210 may include a variable delay unit 211, and an enable signal generation unit 212. The variable delay unit 211 may provide the preset amount of delay. The variable delay unit 211 may receive the detection signal DET, delay the detection signal DET by the preset amount of delay, and may output a delayed detection signal DETD. The amount of delay of the variable delay unit 211 can be set by a delay selection signal dsel<0:n>.

The enable signal generation unit 212 may generate the enable signal EN in response to the detection signal DET and the delayed detection signal DETD. The enable signal generation unit 212 can enable the enable signal EN when the pulse of the detection signal DET and the pulse of the delayed detection signal DETD overlap each other. In FIG. 4, the enable signal generation unit 212 may include an AND gate. The AND gate receives the detection signal DET and the delayed detection signal DETD, and generates the enable signal EN.

The output unit 220 may generate a result signal P/F in response to the enable signal EN. When the enable signal EN is enabled, the output unit 220 may generate the result signal P/F, for example, having a high level (i.e., high voltage logic level or voltage level), and maintains the result signal P/F at the high level. In FIG. 4, the output unit 220 may include a PMOS transistor PM, an NMOS transistor NM, and a latch unit LAT. The PMOS transistor PM may receive an inversion signal of a test mode signal TM, and provides an external voltage to a first node n1. The NMOS transistor NM may receive the enable signal EN, and provide a ground voltage to the first node n1. The latch unit LAT inverses and latches a signal of the first node n1 to generate the result signal P/F. When the test mode signal TM is enabled, the output unit 220 drives the first node n1 to be a high level, and the latch unit LAT latches the result signal P/F to a low level (i.e., low voltage logic level or voltage level). When the enable signal EN is not enabled, the output unit 220 may maintain the result signal P/F at a low level without any change. When the enable signal EN is enabled, the NMOS transistor NM may drive the first node n1 with the ground voltage, and the latch unit LAT transitions the result signal P/F to a high level and maintains the result signal P/F at the high level.

In FIG. 4, the determination unit 200 can additionally include an input unit 230. The input unit 230 may enable the detection signal DET to be inputted to the comparison unit 210 in a test operation. The input unit 230 may include an AND gate. The AND gate receives the detection signal DET and the test mode signal TM. Accordingly, when the test mode signal TM is enabled, the input unit 230 can provide the detection signal DET to the comparison unit 210.

Figure 5:
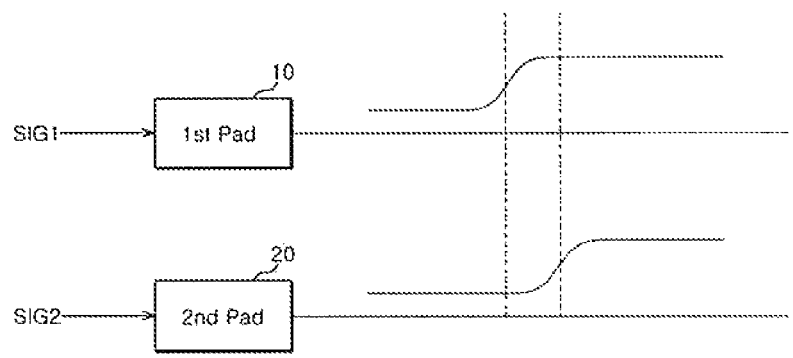
FIG. 5 is a diagram illustrating the phase differences of received signals with respect to when bump bonding of the first and second pads is normally formed and when the bump bonding is incompletely formed.
Figure 6A:
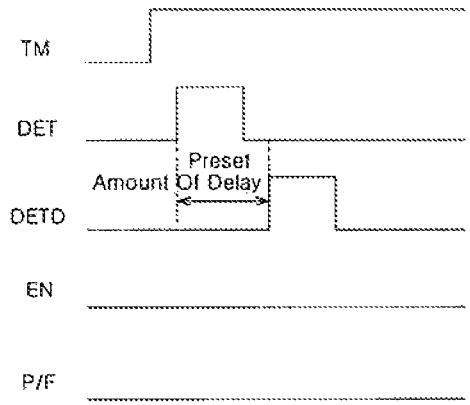
FIGS. 6a and 6b are timing diagrams illustrating the operation of a semiconductor device according to an embodiment.
Figure 6B:
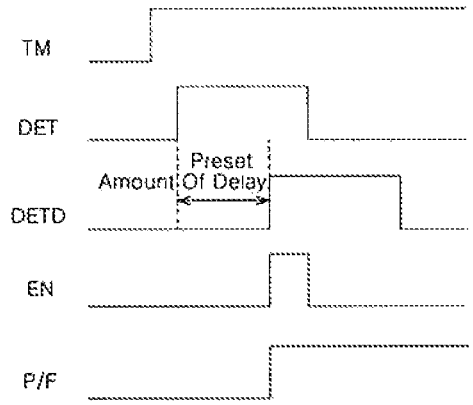

FIG. 5 is a diagram illustrating the phase differences of received signals with respect to when bump bonding of first and second pads 10 and 20 is normally formed and when the bump bonding is incompletely formed, and FIGS. 6a and 6b are timing diagrams illustrating the operation of a semiconductor device 1 according to an embodiment. The following description will be given with respect to the operation of a semiconductor device 1 according to an embodiment with reference to FIGS. 1 to 6b.

As illustrated in FIG. 5, when the bump bonding of the first pad 10 is normally formed, and the bump bonding of the second pad 20 is incompletely formed, a phase difference occurs between signals received through the first and second pads 10 and 20 although the signals have been inputted at the same time point from an exterior.

For a test operation, a test mode signal TM is enabled. The phase difference detection unit 100 generates a detection signal DET which has a phase width corresponding to the phase difference between the first and second signals SIG1 and SIG2 received through the first and second pads 10 and 20. The comparison unit 210 of the determination unit 200 delays the detection signal DET to generate a delayed detection signal DETD, wherein depending on the detection signal DET and the delayed detection signal DETD overlap each other, it is determined whether or not to enable the enable signal EN.

As illustrated in FIG. 6a, when the phase difference between the first and second signals SIG1 and SIG2 received through the first and second pads 10 and 20 is small, the detection signal DET having a narrow pulse width is generated. Since the delayed detection signal DETD obtained by delaying the detection signal DET by a preset amount of delay has no portion overlapping with the detection signal DET, the comparison unit 210 maintains the enable signal EN at a disable state. When the enable signal EN is maintained at a disable state, the output unit 220 maintains a result signal P/F at a low level. When the result signal P/F is at a low level, it can be determined that the bump bonding of the first and second pads 10 and 20 has all been normally formed.

As illustrated in FIG. 6b, when the phase difference between the first and second signals SIG1 and SIG2 received through the first and second pads 10 and 20 is large, the detection signal DET having a wide pulse width is generated. Although the detection signal DET is delayed by a preset amount of delay, a portion overlapping with the delayed detection signal DETD occurs because the pulse width of the detection signal DET is wide. When the pulse of the detection signal DET and the pulse of the delayed detection signal DETD overlap each other, the comparison unit 210 enables the enable signal EN. When the enable signal EN is enabled, the output unit 220 transitions the result signal P/F to a high level and maintains the result signal P/F at the high level. When the result signal P/F is at a high level, it can be determined that the bump bonding of one of the first and second pads 10 and 20 has been incompletely formed.

In an embodiment, in order to increase the accuracy of the test operation according to an embodiment, it is possible to apply external signals to three or more pads, to detect phase differences between signals received through the respective pads, and to obtain the result signal. Otherwise, it is possible to set one pad as a reference pad, to compare an external signal received through the reference pad with each of external signals received through a plurality of other pads, and to simultaneously or individually test whether or not bump bonding of all the pads has been normally formed.

While various embodiments have been described above, it will be understood to those skilled in the art that the embodiments described are by way of example only. Accordingly, the device described herein should not be limited based on the described embodiments.

What is claimed is:

1. A test device comprising:
 a phase difference detection unit configured to receive a first signal received only through a first pad and a second signal received only through a second pad and to detect a phase difference only between the first signal and the second signal, wherein the first signal is delayed according to a bonding status of the first pad and the second signal is delayed according to a bonding status of the second pad; and
 a determination unit configured to compare the detected phase difference with a preset amount of delay, and to output a result signal.

2. The test device according to claim 1, wherein the phase difference detection unit generates a detection signal which has a pulse width corresponding to the phase difference.

3. The test device according to claim 2, wherein the determination unit comprises:
 a comparison unit configured to compare the pulse width of the detection signal with the preset amount of delay, and to generate an enable signal; and
 an output unit configured to generate the result signal in response to the enable signal.

4. The test device according to claim 3, wherein the determination unit comprises an input unit for receiving the detection signal and a test mode signal, and for outputting the detection signal to the comparison unit.

5. The test device according to claim 3, wherein the comparison unit comprises:
 a variable delay unit configured to set an amount of delay in response to a delay selection signal, and to delay the detection signal by the preset amount of delay to generate a delayed detection signal; and
 an enable signal generation unit configured to generate the enable signal depending on the phases of the detection signal and the delayed detection signal.

6. The test device according to claim 3, wherein the output unit comprises:
 a PMOS transistor for receiving a test mode signal and for providing an external voltage to a first node;
 a NMOS transistor for receiving the enable signal and for providing a ground voltage to the first node; and
 a latch unit for inversing and latching a signal of the first node to generate the result signal.

7. The test device according to claim 1, wherein the phase difference detection unit comprises an exclusive OR gate for receiving the first signal and the second signal and outputting a detection signal.

8. A semiconductor device comprising:
a first pad;
a second pad;
a first reception unit configured to receive a first signal which is inputted through the first pad, wherein the first signal is delayed according to a bonding status of the first pad;
a second reception unit configured to receive a second signal which is inputted through the second pad, wherein the second signal is delayed according to a bonding status of the second pad;
a phase difference detection unit configured to receive the first signal only from the first reception unit and the second signal only from the second reception unit and to detect a phase difference only between the outputs of the first and second reception units; and
a determination unit configured to compare the phase difference with a preset amount of delay, and to output a result signal.

9. The semiconductor device according to claim 8, wherein the phase difference detection unit generates a detection signal which has a pulse width corresponding to the phase difference.

10. The semiconductor device according to claim 9, wherein the determination unit comprises:
a comparison unit configured to compare the pulse width of the detection signal with the preset amount of delay, and to generate an enable signal; and
an output unit configured to generate the result signal in response to the enable signal.

11. The semiconductor device according to claim 10, wherein the comparison unit comprises:
a variable delay unit configured to set an amount of delay in response to a delay selection signal, and to delay the detection signal by the preset amount of delay to generate a delayed detection signal; and
an enable signal generation unit configured to generate the enable signal depending on the phases of the detection signal and the delayed detection signal.

12. The semiconductor device according to claim 10, wherein the output unit comprises:
a PMOS transistor for receiving a test mode signal and for providing an external voltage to a first node;
a NMOS transistor for receiving the enable signal and for providing a ground voltage to the first node; and
a latch unit for inversing and latching a signal of the first node to generate the result signal.

13. The semiconductor device according to claim 8, wherein the first and second pads are bump bonding pads.

14. The semiconductor device according to claim 8, wherein the first and second pads are flip chip bonding pads.

15. A semiconductor device comprising:
a plurality of pads configured to receive external signals, wherein the external signals are delayed according to each of bonding status of the plurality of pads;
a phase difference detection unit configured to receive the external signals only from each of the plurality pads and to detect a phase difference only between the external signals received through the plurality of pads; and
a determination unit configured to compare the phase difference with a preset amount of delay, and to output a result signal.

16. The semiconductor device according to claim 15, wherein the phase difference detection unit generates a detection signal which has a pulse width corresponding to the phase difference.

17. The semiconductor device according to claim 16, wherein the determination unit comprises:
a comparison unit configured to compare the pulse width of the detection signal with the preset amount of delay, and to generate an enable signal; and
an output unit configured to generate the result signal in response to the enable signal.

18. The semiconductor device according to claim 17, wherein the comparison unit comprises:
a variable delay unit configured to set an amount of delay in response to a delay selection signal, and to delay the detection signal by the preset amount of delay to generate a delayed detection signal; and
an enable signal generation unit configured to generate the enable signal depending on the phases of the detection signal and the delayed detection signal.

19. The semiconductor device according to claim 15, wherein the plurality of pads are bump bonding pads.

20. The semiconductor device according to claim 15, wherein the plurality of pads are flip chip bonding pads.

* * * * *